United States Patent
Shearer et al.

(10) Patent No.: US 12,388,004 B2
(45) Date of Patent: Aug. 12, 2025

(54) LITHOGRAPHICALLY DEFINED ELECTRICAL INTERCONNECTS FROM CONDUCTIVE PASTES

(71) Applicant: ORMET CIRCUITS, INC., San Diego, CA (US)

(72) Inventors: Catherine A. Shearer, San Marcos, CA (US); Ping-Hung Lu, Bridgewater, NJ (US); Chunwei Chen, Whitehouse Station, NJ (US)

(73) Assignee: Ormet Circuits, Inc., San Diego, CA (US)

( * ) Notice: Subject to any disclaimer, the term of this patent is extended or adjusted under 35 U.S.C. 154(b) by 580 days.

(21) Appl. No.: 17/640,390

(22) PCT Filed: Sep. 9, 2020

(86) PCT No.: PCT/US2020/049803
§ 371 (c)(1),
(2) Date: Mar. 4, 2022

(87) PCT Pub. No.: WO2021/050453
PCT Pub. Date: Mar. 18, 2021

(65) Prior Publication Data
US 2022/0336341 A1    Oct. 20, 2022

Related U.S. Application Data

(60) Provisional application No. 62/899,303, filed on Sep. 12, 2019.

(51) Int. Cl.
*H01L 23/498* (2006.01)
*H01L 21/48* (2006.01)
(Continued)

(52) U.S. Cl.
CPC .... *H01L 23/49883* (2013.01); *H01L 21/4867* (2013.01); *H01L 23/49811* (2013.01); *H05K 1/092* (2013.01)

(58) Field of Classification Search
CPC ......... H01L 23/49883; H01L 23/49811; H01L 21/4867; H05K 1/092
See application file for complete search history.

(56) References Cited

U.S. PATENT DOCUMENTS

| 5,024,372 A | 6/1991 | Altman et al. |
| 5,641,113 A * | 6/1997 | Somaki ............... H05K 3/3436 29/879 |

(Continued)

FOREIGN PATENT DOCUMENTS

| EP | 1022774 A2 | 7/2000 |
| TW | 201727373 A | 8/2017 |

(Continued)

OTHER PUBLICATIONS

International Search Report and Written Opinion, PCT/US2020/049803, Sep. 9, 2020.

*Primary Examiner* — Mohsen Ahmadi
(74) *Attorney, Agent, or Firm* — Dann, Dorfman, Herrell and Skillman, P.C.

(57) ABSTRACT

The present invention relates to electrical interconnect structures formed from a lithographically defined polymer coating in conjunction with a conductive paste, and methods for forming same.

11 Claims, 4 Drawing Sheets

(51) Int. Cl.
*H01L 23/00* (2006.01)
*H05K 1/09* (2006.01)

(56) References Cited

U.S. PATENT DOCUMENTS

| | | | | |
|---|---|---|---|---|
| 5,829,668 | A * | 11/1998 | George | H01L 21/6835 |
| | | | | 228/248.1 |
| 2003/0222343 | A1 | 12/2003 | Sakaida | |
| 2009/0184419 | A1* | 7/2009 | Pendse | H05K 3/3452 |
| | | | | 257/737 |
| 2014/0048931 | A1 | 2/2014 | Kumar et al. | |
| 2014/0361431 | A1* | 12/2014 | Matsumoto | H01L 24/03 |
| | | | | 257/737 |
| 2015/0340328 | A1* | 11/2015 | Gandhi | H01L 24/03 |
| | | | | 257/762 |
| 2016/0218074 | A1* | 7/2016 | Seddon | H01L 24/30 |
| 2016/0293576 | A1* | 10/2016 | Wang | H01L 24/97 |
| 2018/0076163 | A1 | 3/2018 | Aoki et al. | |
| 2018/0374812 | A1* | 12/2018 | Aoki | H01L 23/49811 |

FOREIGN PATENT DOCUMENTS

| | | |
|---|---|---|
| WO | 1998/39781 A1 | 9/1998 |
| WO | 2014008982 A1 | 1/2014 |
| WO | 2015099684 A1 | 7/2015 |
| WO | 2016174584 A1 | 11/2016 |
| WO | 2018231612 A2 | 12/2018 |
| WO | 2019113208 A1 | 6/2019 |

* cited by examiner

LITHOGRAPHICALLY DEFINED ELECTRICAL INTERCONNECTS FROM CONDUCTIVE PASTES

FIELD OF THE INVENTION

The invention relates to the electrical interconnection of devices within an electronic module. More specifically it relates to the electrical interconnection between discrete electronic devices, either singular or as part of a module, either packaged or unpackaged, prior to attachment to a printed circuit board. Even more specifically, the invention relates to the formation of fine feature electrical interconnections from conductive pastes and lithographically defined molds.

BACKGROUND OF THE INVENTION

The mobile electronics industry is rapidly growing. The market drivers for new product generations are continually towards faster performance and higher functionality in a less expensive, lighter product with a longer battery life. All segments of the electronics industry are changing to meet these demands. This includes the discrete electronic devices as well as the packaging schemes and architectures used to interconnect them.

Traditionally, active semiconductor devices have been packaged individually and then assembled onto the surface of a circuit board along with all the devices necessary for the product to function. Much of the size reduction in earlier generations of mobile electronic devices was due to increases in the performance of the active semiconductor die and functionality per unit area. Shrinkage of the individual die packages down to about the size of the die was a significant contribution to the product shrinkage of the second wave of miniaturization. The emphasis of the current wave of mobile electronic product evolution is integration of multiple devices—both active and passive—into a single package, and by creating combinations of packages that enhance speed and functionality prior to assembly onto the circuit board.

This new wave of package integration has spurred an exploration of a wide variety of new packaging strategies and architectures. One major aspect of the package integration trend is a transition from two-dimensional to three-dimensional architectures. There are numerous electrical performance, mechanical performance and reliability considerations that need to be taken into account in order to support three-dimensional integrated package architectures. This is particularly pressing in the packaging of high performance semiconductor devices where the signal interconnection points per unit area are continuing to increase. For these devices, three-dimensional architectures are evolving simultaneously with increased electrical interconnect density in the two-dimensional array.

Electrical interconnections in the vertical axis between packages are a particularly active area of development. The industry term for stacking an electrically interconnecting two or more semiconductor packages is "package on package" or "POP." Electrical interconnection between packages in a POP architecture is referred to as z-axis interconnection.

Electrical performance, mechanical performance and reliability are all significant challenges in the production of z-axis interconnections in POP architectures. Z-axis interconnections typically must be small in cross sectional area and are often placed close together, but the z-axis distance to be spanned can vary considerably. It is frequently preferable for the z-axis height of the interconnection to be taller than the electrical conductor is wide. In addition, the z-axis conductor, despite frequently being small in cross sectional area, must also provide a robust mechanical and electrical connection from one package electrical termination to the other. The z-axis interconnection must also be able to withstand mechanical strains imposed by differences in thermal expansion of the packages joined as well as those imposed by surrounding materials that mechanically couple the interconnections and packages together. The z-axis interconnect must also be able to withstand multiple solder reflow cycles to ensure the assembly to the circuit board and any potential rework can be accommodated. Finally, in the design of any z-axis interconnection strategy, cost is also a factor that is manifested in manufacturing of the POP, yield and reliability.

Several strategies have been proposed to create z-axis interconnections in POP architectures. Solder balls on the periphery, overmolded solder balls, plated bumps encased by mold compound (aka copper pillars), and solder balls filled into holes prepared in the mold compound have all been proposed to traverse the z-axis distance from the underlying package substrate interconnection pads to those on the overlying package. A variety of interposer structures have also been proposed and investigated. All of these solutions have limitations and the field of development is very active.

The existing proposed solutions suffer from a wide variety of defects. Enlarging the footprint of the lower package substrate to accommodate periphery solder balls outside of the perimeter of the mold compound deposited over the active device is undesirable because it negatively impacts the miniaturization potential for the overall product and creates uneven warpage effects. Encasing the solder balls within the perimeter of the mold compound enables some package shrinkage and reduces the warpage impact, but the height and proximity of the solder ball interconnects is limited by the shape of the ball. Growing plated bumps onto the interconnect pads on the lower substrate prior to overmolding allows for interconnect features that are small in cross-section, potentially quite tall, and that can be placed in close proximity to one another, but the bumps are time-consuming and expensive to plate up and the upper interconnect surface has the potential to be too small to effect a mechanically robust interconnection. Creating holes in the mold compound to accept multiple solder balls yields most of the desired geometry, but the connection to the upper package is supported by a neck to the solder ball that is not well supported by the mold compound and the solder balls are susceptible to remelting during subsequent solder assembly cycles. Interposers are typically an outside the mold perimeter solution, are sometimes made from materials which the industry is not adept at handling (e.g. glass) and can be expensive.

SUMMARY OF THE INVENTION

In its simplest terms the invention structure is a lithographically defined polymer mold on a substrate wherein the features defined within said mold are filled with an electrically conductive composition that forms an electrical connection with the substrate and is thermally processed to a thermosetting form such that it does not melt or change form during subsequent heating cycles.

The lithographically defined polymer is applied to the substrate as a coating, exposed to radiation to establish the pattern of the mold, and chemically developed to define the mold. It is adherent to the substrate, not chemically reactive with the electrically conductive composition, can withstand the thermal process to effect the thermoset state in the electrically conductive composition. without degradation, advancement or distortion; and may be chemically removed after the thermal process to effect the thermoset state in the electrically conductive composition.

The electrically conductive composition is provided in a paste form that can be installed into the depressions in the lithographically defined mold such that the mold is substantially full of paste. During thermal processing, the electrically conductive paste forms an electrical interconnection to conductive features on the substrate and becomes an electrical interconnect element through the bulk of the paste that will not melt or change form during subsequent heating cycles. Once thermally processed, the paste attains a fixed shape and may be plated or soldered to effect electrical interconnection to an overlaying electrical interconnect such as the pads on an overlying POP substrate.

Once the electrically conductive z-axis interconnect features have been lithographically defined into the polymer mold, filled with electrically conductive paste, and thermally processed to effect electrical interconnection to the underlying substrate and through the remainder of the thermoset composition, the lithographically defined polymer may remain as a portion of the final product, or may be chemically removed to leave the thermoset conductive paste deposits as free-standing features.

While the invention is particularly well suited to the application of z-axis interconnect in POP architectures, a wide variety of implementations in which fine-geometry, interconnect patterns are established in a lithographically defined polymer mold are contemplated. Some of these alternative implementations include, but are not limited to, redistribution circuits in the x-y plane, contact pads at the terminus of plated bumps, contact fingers for semiconductor chip test cards, area array interconnect of individual semiconductor die or packages, interposers, height extension for solder interconnections, interconnections directly between semiconductor die, thermal transfer arrays and the like.

DETAILED DESCRIPTION

Figure 1:
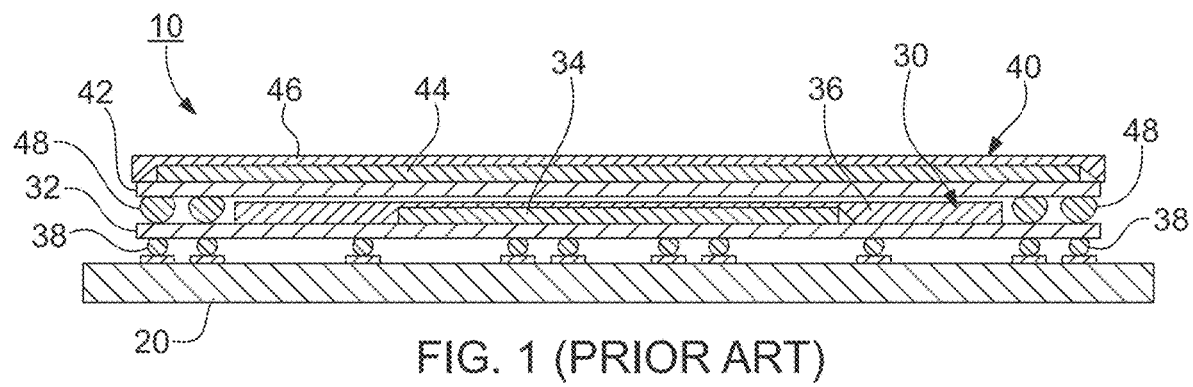
FIG. 1 depicts a common prior art implementation of POP architecture. Note that the substrate of the lower package extends out beyond the perimeter of the mold compound encasing the semiconductor die so that a periphery array of solder balls could be added for interconnection between the upper and lower packages. In one embodiment, the invention structures replace this periphery ring of solder balls. In another embodiment, invention structures allow the periphery array to be moved within the area in the perimeter of the mold compound thus enabling the creation of a POP architecture with a smaller footprint. The invention structures may be advantageously employed in conjunction with a wide variety of specific semiconductor package types and in a wide variety of POP architectures.
Figure 2:
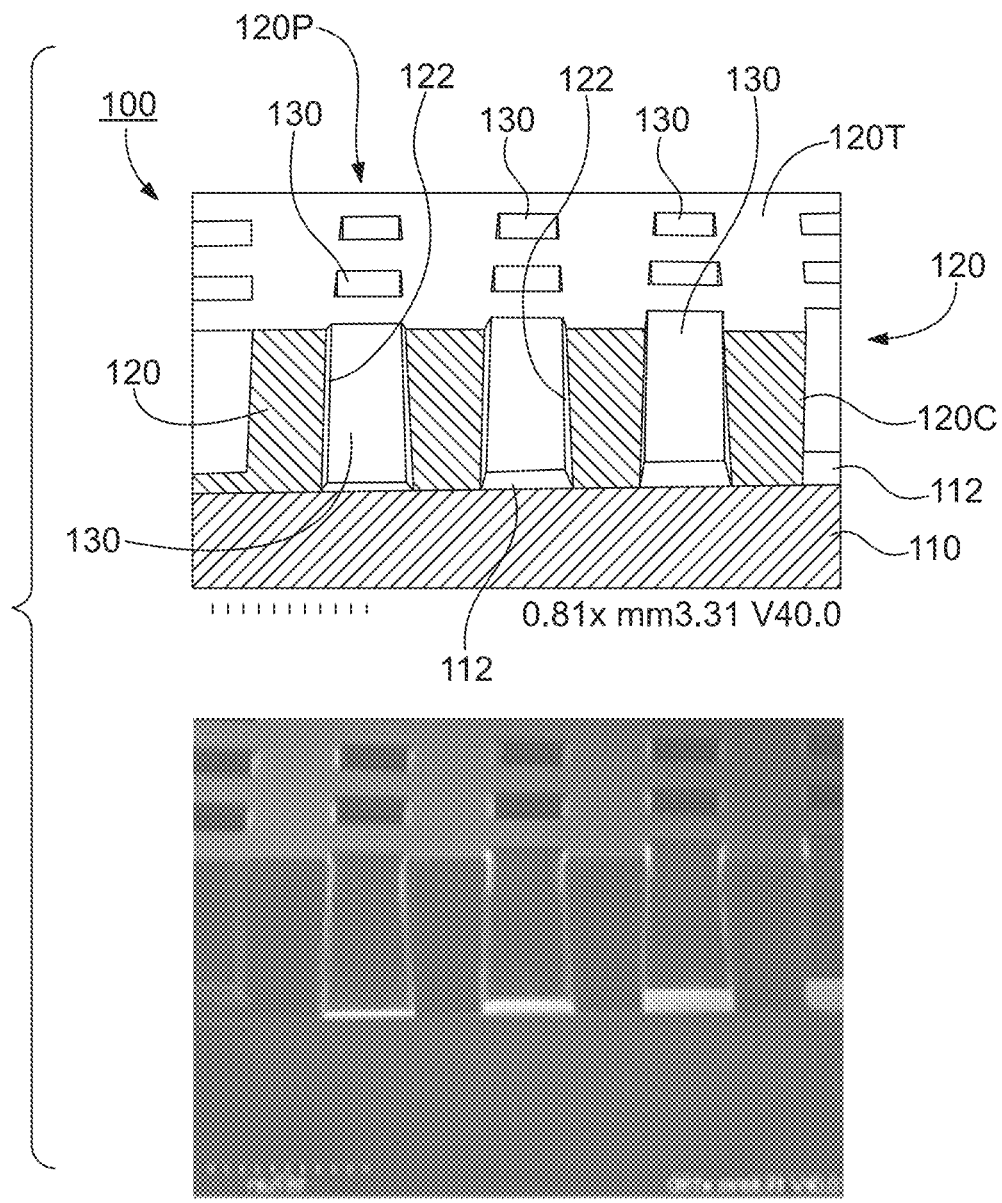
FIG. 2 is a cross-section of a semiconductor wafer bearing a polymer coating that has been lithographically defined to create a mold in the pattern of an array of rectangular-shaped holes. Note the well-defined shape of the holes and that they traverse the entire thickness of the polymer coating to expose the underlying wafer. This feature is key to the invention structure in order to facilitate installation of the conductive paste to create consistently-shaped interconnections that can physically contact and make electrical interconnection to the exposed bottom of the hole. Note also the specificity of the shape of the holes and particularly that the z-axis height of the rectangle in considerably longer than the width as well as the slightly trapezoidal configuration. The lithographically-sensitive polymer used in the formation of the mold and the lithographic process may both be manipulated in the practice of the invention to create mold features with a wide variety of geometrical specificity as best suits the implementation. For instance, the z-axis height dimension may be made quite large to accommodate a relatively thick lower package in the POP module while maintaining a high density of vertical interconnections within a small area footprint. In another example, the inverse trapezoidal shape might be exaggerated to create a larger terminus pad at the top of the z-axis interconnect in order to facilitate a robust mechanical and electrical interconnection to the overlying package. A key factor of the invention structures is that the lithographically-sensitive polymer selected is capable of maintaining the shape of the lithographically-defined features throughout the installation and thermal processing of the conductive paste used to create the electrically conductive interconnects.

The invention is an electrical interconnect structure comprising:
 a substrate bearing electrically conductive elements on at least one surface thereof;
 a polymer coating on said substrate, wherein said polymer coating has been lithographically defined in a pattern of features that:
  traverse said polymer coating in the axis perpendicular to said surface,
  expose said electrically conductive elements on said surface,
  in which said pattern of features is open at the surface of said coating not in contact with said substrate; and
 a conductive paste installed in said features such that:
  Said conductive paste substantially fills said features,
  Said conductive paste is in physical and electrical contact with said electrically conductive elements, and
  Said conductive paste has been thermally processed to effect a thermoset electrical interconnect.

The electrical interconnect structures of the invention may or may not be subsequently processed to selectively remove the polymer coating.

The invention structures may be advantageously deployed in a variety of electrical interconnect applications including, but not limited to electrical interconnections between discrete electronic devices, either singularly or as part of a module, either packaged or unpackaged, prior to attachment to a printed circuit board. In particular, the invention structures may be advantageously deployed in a variety of electrical interconnect applications including, but not limited to z-axis interconnections in POP architectures, redistribution circuits in the x-y plane, contact pads at the terminus of plated bumps, contact fingers for semiconductor chip test cards, area array interconnect of individual semiconductor die or packages, interposers, height extension for solder interconnections, interconnections directly between semiconductor die, thermal transfer arrays and the like. Presently preferred is the implementation in z-axis interconnect in POP architectures.

Depending on the specific implementation, the substrate may be any of a variety of structures commonly found in electronic modules. Structures contemplated as the substrate include, but are not limited to, semiconductor dies, passive electronic components, lead frames, packaged semiconductor components, printed circuit boards, electronic substrates, stacked die, flexible circuits, solar panels, electronic modules and electrical subsystems. Presently preferred are substrates used in the packaging of semiconductor die. Typically, such substrates bear a semiconductor die mechanically attached to one surface and electrically interconnected to circuits which are on both opposing major surfaces and traverse the thickness of the substrate. Typical substrate materials are polymers, polymer laminates, ceramics, polymer-coated metal sheets, glass and the like.

The conductive elements on the surface of the substrate in the invention structures may likewise be a variety of materials depending on the specific implementation. Conductive elements contemplated for use in the practice of the invention include copper pads, copper pads bearing metallic surface finishes (e.g. gold over nickel, silver, gold over palladium over nickel), copper pads with organic surface treatments, aluminum pads, conductive paste deposits, gold bumps, solder deposits, solder balls, copper pillars, copper bumps, sintered metals, thick film conductors and the like. Most typically, the conductive elements of the invention structures are copper pads that may or may not bear metallic coatings.

The polymer coating of invention structures may be any that can be lithographically patterned to form features of the desired geometry, expose the underlying conductive elements, and that will substantially maintain the defined feature geometry through installation and thermal processing of the conductive paste.

The polymer coating of the invention structure may be applied to the substrate by any method commonly known to those of ordinary skill in the art. Coating techniques that may be employed include, but are not limited to, spin coating, extrusion, slot coating, curtain coating, doctor blading, spraying, screen printing and the like.

Polymer coatings contemplated in the invention structures include photoresist materials. Both positive tone (e.g., bonds within the polymer backbone are broken during irradiation) and negative tone (e.g., cross links are formed between polymer molecules during irradiation) resists are contemplated for use in the invention. Chemically enhanced resists are contemplated to facilitate the formation of fine feature geometries through thick coatings (e.g. 50-500 micron). In implementations in which it is desirable to subsequently selectively remove the polymer coating from the invention electrical interconnect structure, the ability to chemically strip the polymer coating from the substrate after the thermal processing necessary to effect the formation of a thermoset electrical interconnect is also an important selection factor. Thermal stability of the polymer coating through the thermal processing of the conductive paste is a crucial factor. For instance, polymer coating materials that melt, char or have significant dimension change during the thermal exposure necessary to process the conductive paste would not be suitable for the invention. In addition, the ability to image accurately through a thick coating to create well-defined, thermally stable, high-aspect ratio molds is an advantageous feature in the application of the invention. In some embodiments, it may be desirable to have a polymer coating chemistry that is suitable for retention in the final construction. Therefore, polymer coatings that would easily degrade, cause warpage, impede adhesion to other package elements, and the like; may be unsuitable for these embodiments. Finally, use of a polymer coating that is applied as a liquid may be advantageous for certain embodiments of the invention in order to level uneven topography or to offer versatility in coating thickness. Particularly suitable polymer coatings are chemically enhanced, negative tone, thick film resists such as the AZ 200 nXT line offered by EMD Performance Materials Corp.

The pattern of features defined in the polymer coating may be formed by any lithographic process known to those of ordinary skill in the art. The nature of the mask used to effect the pattern will depend on the nature of the polymer coating selected. Likewise, the specific coating application, bake, exposure and development processes will be specific to the particular polymer coating selected for use.

Any conductive paste may be used in the invention structures provided that it is a suitable consistency for filling the features, forms an electrical connection to the conductive elements, and can be thermally processed to create an electrical interconnect that is thermoset and will not undergo significant changes in shape in subsequent thermal excursions. In this description of the invention the term thermoset means that some portion of the conductive paste must undergo an irreversible reaction during thermal processing such that the resulting electrical interconnect feature maintains its form in subsequent thermal exposures, even if the surrounding polymer coating defining the feature has been removed. Metal-filled thermosetting polymer pastes, pastes with nano-particles that undergo sintering, organo-metallic pastes in which the organic decomposes to yield a fused metal, and transient liquid phase sintering pastes are all specifically contemplated. Presently, transient liquid phase sintering pastes such as the Ormet line of products offered by Ormet Circuits, Inc. are preferred. Suitable conductive pastes are described, for example, in patent publication numbers WO2014/082100, WO2016/174584, WO2018/231612, and WO2019/113208, each of which is hereby incorporated by reference herein in its entirety.

Transient liquid phase sintering (TLPS) electrically conductive pastes offer a thermosetting metallic system rather than a thermosetting polymer system. In TLPS conductive pastes, a relatively low melting point alloy and a relatively high melting point metal are mixed in particulate form. As the temperature is raised to the melting point of the alloy, the alloy particles become molten. The reactive element(s) within the relatively low melting alloy then react with the receptive high melting point metal to form new alloy compositions and/or intermetallics. TLPS compositions thus undergo a thermosetting reaction, both within the bulk of the paste and at any interface with a solderable material, to form a mixture of intermetallic and alloy products that all have substantially higher melting temperatures than the initial solder alloy powder melt temperature. For this reason, TLPS compositions provide good electrical conductivity with little opportunity for conductivity deterioration due to oxidation, corrosion or thermal expansion and contraction. The TLPS reaction is irreversible and the platable and solderable interconnect features formed will not undergo a significant melt or change in shape in any subsequent high temperature exposures.

Conductive pastes may be installed in invention structures by any means known to those of skill in the art. The use of a doctor blade, squeegee, pressure-assisted squeegee, pressure head, dispensing tool and vacuum chamber are all explicitly contemplated as potentially useful tools in the installation of the conductive paste into the features traversing the polymer coating. The conductive pastes can be installed to substantially fill the pattern of features. The term "substantially fill" is intended to refer to features that are more than 50% filled, more than 75% filled, more than 85% filled, more than 90% filled, or more than 95% filled. In particular, the pattern of features should be filled such that the conductive paste is in physical, electrical and/or thermal contact with said electrically conductive elements.

Thermal processing of the conductive paste may be achieved by any means known to those of skill in the art. The specific processing regime will be dependent on the specific materials selected and the nature of the electrical interconnect structure to be formed.

If desired, the polymer coating can be selectively removed. Removal of the polymer coating may be achieved by any means known to those of skill in the art. The specific processing regime will be dependent on the specific materials selected and the nature of the electrical interconnect structure to be formed. Typically, removal of the polymer coating would be performed after thermal processing of the conductive paste.

It will be appreciated by skilled artisans that the invention of this application may be practiced in a variety of configurations and permutations that would fall within the practical scope of this disclosure.

The invention may be better understood by the following, non-limiting, example.

Examples

Reference will now be made to more specific embodiments of the present disclosure and experimental results that provide support for such embodiments. However, Applicants note that the disclosure below is for illustrative purposes only and is not intended to limit the scope of the claimed subject matter in any way.

A feasibility demonstration of the invention structures was prepared in the following manner.

A silicon wafer bearing 3500 angstroms of copper was coated with AZ 200 nXT thick film resist. The coating was applied in two spin coat applications for a total coating thickness of 180 micron. The coating was subjected to a 960 second soft bake at 140 degrees Celsius and then irradiated through a mask at a dosage of 1800 mJ/cm$^2$. The exposure unit used was a Suss MA200 CC Mask Aligner with a 40 micron proximity gap.

The pattern in the coating on the silicon wafer was developed using the chemical developer solution AZ 300 MIF to selectively remove the polymer coating from the pattern such that openings of a desired geometry were created that traverse the thickness of the polymer coating and terminate at the bare surface of the copper layer.

The openings traversing the polymer coating were filled with Ormet 710 conductive paste using a Mass VHF 300 V hole filling machine. The filling operation is conducted in a vacuum chamber with a pressure assisted squeegee head.

Once filled, the Ormet 710 in the openings in the polymer coating was dried at 100 degrees Celsius to evaporate the solvent and then the paste was sintered in a lamination press at 200 psi and 200 degrees Celsius for 10 minutes. In the sintering process, the metals in the Ormet 710 conductive paste react to form a thermoset metal matrix.

After the sintering reaction was completed the silicon wafer was cross-sectioned and photographed under high magnification.

Figure 3:
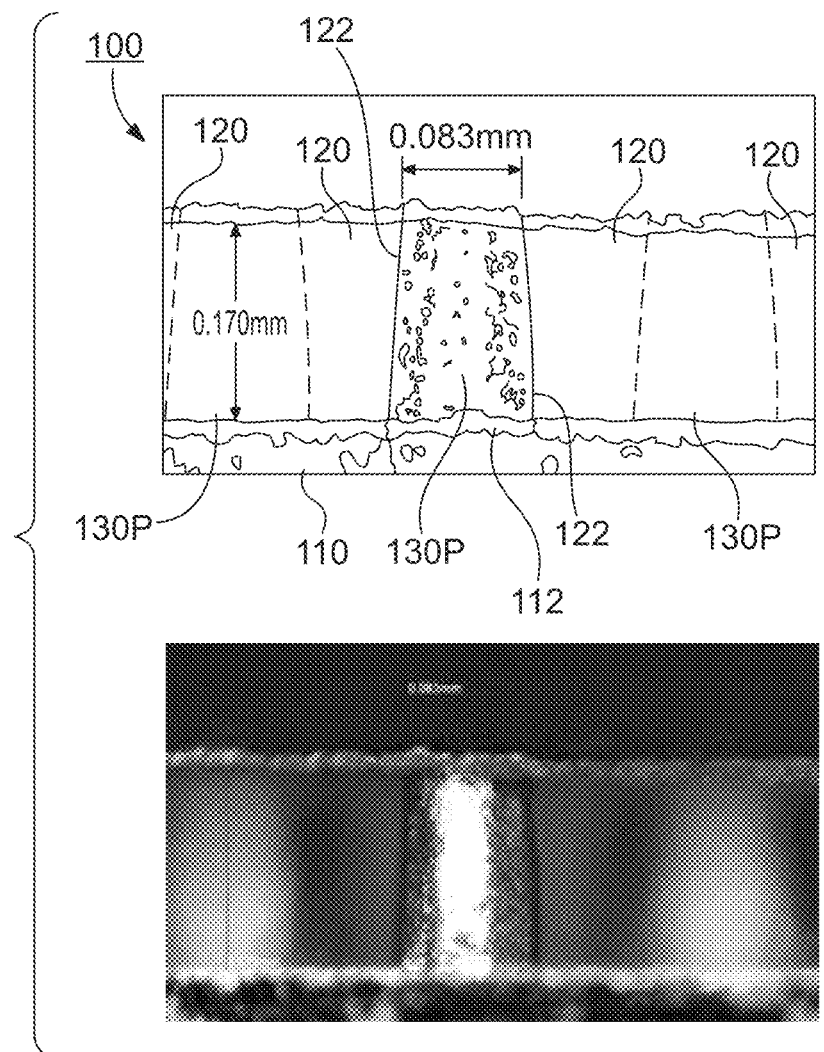
FIG. 3 is a cross section of an invention structure in which the lithographically-defined polymer mold has been filled with electrically conductive paste and thermally processed to effect the thermoset electrical interconnect features. Note that the mold is well-filled, that there is no apparent deterioration of the regularity of the shape of the feature as defined by the mold and that the conductive paste interconnect is highly regular in shape and traverses the z-axis thickness of the mold to make direct contact with the underlying substrate. Note also that there is a sharp distinction along the boundary between the polymer mold and the conductive paste interconnect which suggests that there is no chemical interference between the two materials that might deleteriously affect the electrical characteristics of the conductive paste interconnect feature. Further note the fine dimensions of the electrical interconnect with the z-axis height measured at approximately 180 microns and the width of the z-axis interconnection at approximately 80 micron.
Figure 4:
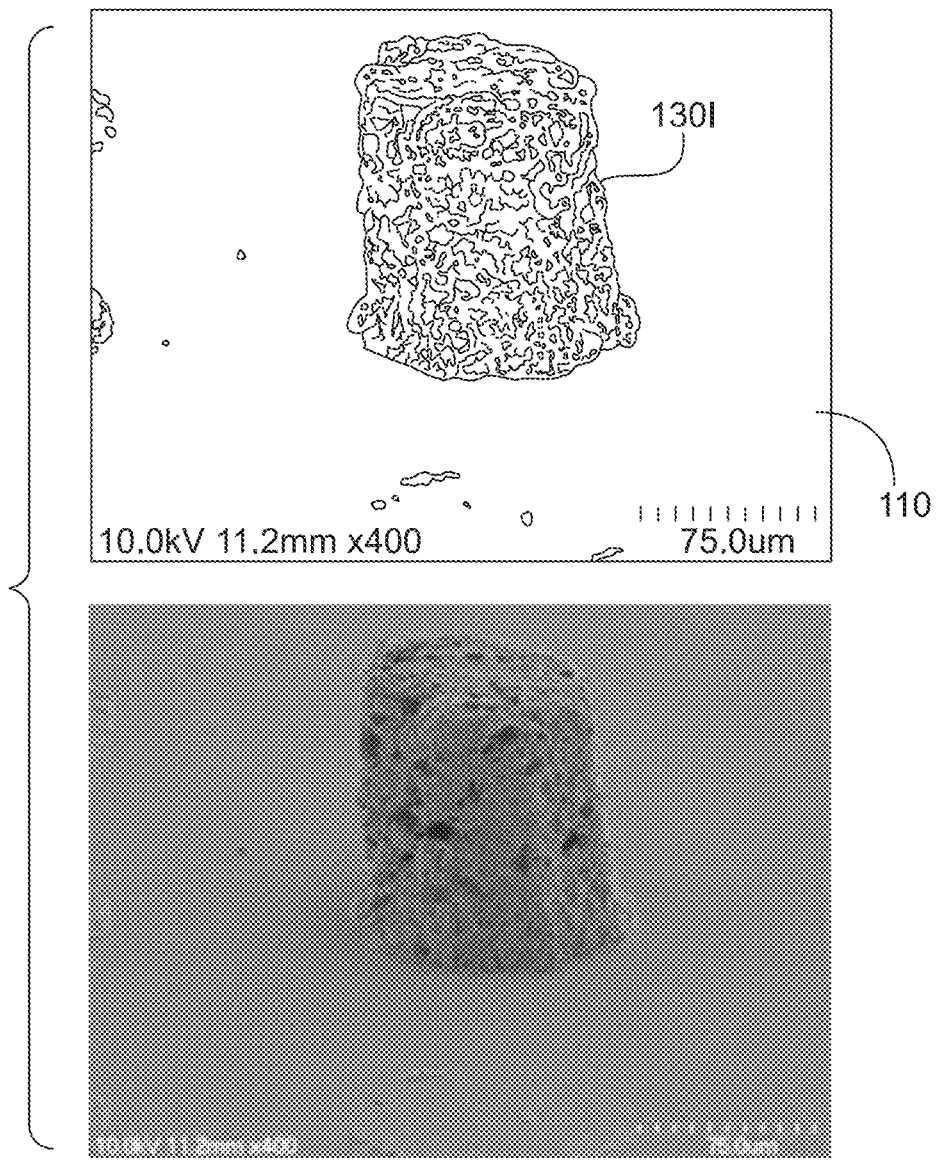
FIG. 4 is an optical image of an invention structure in which the lithographically-defined polymer mold has been removed by a selective process, leaving the conductive paste interconnection feature as a free-standing element.

As can be seen in FIG. 3, the Ormet 710 completely filled the openings traversing the thickness of the polymer coating and is in contact with the copper surface. The Ormet 710 has changed in color from the brown color of the raw paste to a silver color, which indicates that the sintering operation was successful in forming and electrically conductive feature and that the chemistry of the polymer coating did not interfere with the sintering process. The desired feature shape has been maintained through the filling and sintering operations. When the polymer coating was peeled away from the wafer a portion of the sintered conductive paste remained affixed to the surface of the copper and appeared to have metallurgically bonded to it.

This experiment demonstrated that the invention structures can be successfully produced.

We claim:

1. An electrical interconnect structure comprising:
   a. a substrate bearing electrically conductive elements on at least one surface thereof;
   b. a polymer coating on the at least one surface of said substrate, wherein said polymer coating has been lithographically defined in a pattern of features, wherein the features:
      i) traverse said polymer coating in an axis perpendicular to said at least one surface,
      ii) expose said electrically conductive elements on said at least one surface, and
      iii) are open from a surface of said polymer coating that is not in contact with said substrate to the at least one surface; and
   c. a conductive paste installed in said pattern of features wherein:
      i) said conductive paste substantially fills said features of said pattern of features,
      ii) said conductive paste is in physical and electrical contact with said electrically conductive elements, and
      iii) said conductive paste has been thermally processed to effect a thermoset electrical interconnect; and
   d. said polymer coating has been selectively removed from said substrate thereby leaving plural thermoset electrical interconnects on said substrate in a pattern corresponding to the pattern of openings in said polymer coating.

2. A process for forming an electrical interconnect structure comprising the steps of:
   a. coating a substrate with a polymer to form a polymer coating on said substrate, wherein said substrate bears electrically conductive elements on at least one surface thereof;

b. lithographically treating said polymer coating to define a pattern of features wherein the features:
   i) traverse said polymer coating in an axis perpendicular to said at least one surface,
   ii) expose said electrically conductive elements on said at least one surface, and
   iii) are open from a surface of said polymer coating that is not in contact with said substrate to the at least one surface;
c. installing a thermosetting conductive paste in said pattern of features wherein:
   i) said conductive paste substantially fills said features of said pattern of features, and
   ii) said conductive paste is in physical and electrical contact with said electrically conductive elements; and
d. selectively removing said polymer coating from said substrate after thermally processing said conductive paste thereby leaving plural thermoset electrical interconnects on said substrate in a pattern corresponding to the pattern of openings in said polymer coating.

3. The process of claim 2, further comprising the step of thermally processing said conductive paste to effect a thermoset electrical interconnect.

4. An electrical interconnect structure comprising:
a substrate having plural electrically conductive elements on a first surface thereof;
a coating of a polymer disposed on the first surface of the substrate, wherein the polymer coating has been lithographically processed to produce a pattern of openings through the polymer coating that expose the plural electrically conductive elements of the substrate;
a thermosetting electrically conductive paste disposed in the openings of the pattern of openings through the polymer coating, wherein the electrically conductive paste substantially fills each of the openings and the electrically conductive paste in each opening is in physical and electrical contact with the electrically conductive element exposed by that opening, wherein the thermosetting conductive paste has been thermally processed to produce a thermoset electrical interconnect in each opening of the pattern of openings; and
wherein the polymer coating has been selectively removed from the substrate leaving plural thermoset electrical interconnects on the substrate in a pattern corresponding to the pattern of openings in the polymer coating.

5. The electrical interconnect structure of claim 4 wherein the openings of the pattern of openings through the polymer coating are substantially perpendicular to the first surface of the substrate.

6. The electrical interconnect structure of claim 4 wherein the substrate is a semiconductor wafer.

7. A process for forming an electrical interconnect structure comprising the steps of:
coating a first surface of a substrate with a polymer to form a polymer coating thereon, wherein the substrate has a plurality of electrically conductive elements on the first surface thereof;
lithographically processing the polymer coating to produce a pattern of openings through the polymer coating that expose the electrically conductive elements of the substrate;
placing a thermosetting conductive paste into the openings through the polymer coating to substantially fill the openings through the polymer coating and to be in physical and electrical contact with the electrically conductive elements on the first surface of the substrate; and
selectively removing the polymer coating from the substrate after thermally processing the conductive paste thereby leaving plural thermoset electrical interconnects on the substrate in a pattern corresponding to the pattern of openings in the polymer coating.

8. The process of claim 7 further comprising the step of thermally processing the thermosetting electrically conductive paste to produce a thermoset electrical interconnect.

9. The process of claim 8 wherein the openings of the pattern of openings through the polymer coating are rectangular or are trapezoidal or are rectangular in one direction and are trapezoidal in another direction.

10. The process of claim 7 wherein the openings of the pattern of openings through the polymer coating are substantially perpendicular to the first surface of the substrate.

11. The process of claim 7 wherein the substrate is a semiconductor wafer.

* * * * *